United States Patent [19]

Boisvert

[11] Patent Number: 4,849,657
[45] Date of Patent: Jul. 18, 1989

[54] FAULT TOLERANT INTEGRATED CIRCUIT DESIGN

[75] Inventor: Conrad J. Boisvert, San Jose, Calif.

[73] Assignee: Honeywell Inc., Minneapolis, Minn.

[21] Appl. No.: 650,743

[22] Filed: Sep. 17, 1984

[51] Int. Cl.$^4$ .................. H03K 19/003; H01J 19/82; H01S 3/14
[52] U.S. Cl. .................................. 307/441; 307/442; 307/443; 307/219; 371/10; 371/68; 377/75
[58] Field of Search ............... 307/441, 442, 443, 373, 307/219; 371/10, 68; 377/75

[56] References Cited

U.S. PATENT DOCUMENTS

| | | | |
|---|---|---|---|
| 3,303,482 | 2/1967 | Jenkins | 371/68 |
| 4,358,833 | 11/1983 | Folmsbee et al. | 371/10 |
| 4,475,049 | 10/1984 | Smith | 307/219 |

Primary Examiner—Stanley D. Miller
Assistant Examiner—M. R. Wambach
Attorney, Agent, or Firm—W. T. Udseth

[57] ABSTRACT

A fault-tolerant digital integrated circuit includes functionally identical circuit blocks, each of such identical circuit blocks having an input region and an output region. The input regions receive identical input signals and the output regions are electrically connected to a combining logic gate, typically an OR gate. In this way a defect in any one of the identical blocks will not prevent operation of the circuit.

6 Claims, 1 Drawing Sheet

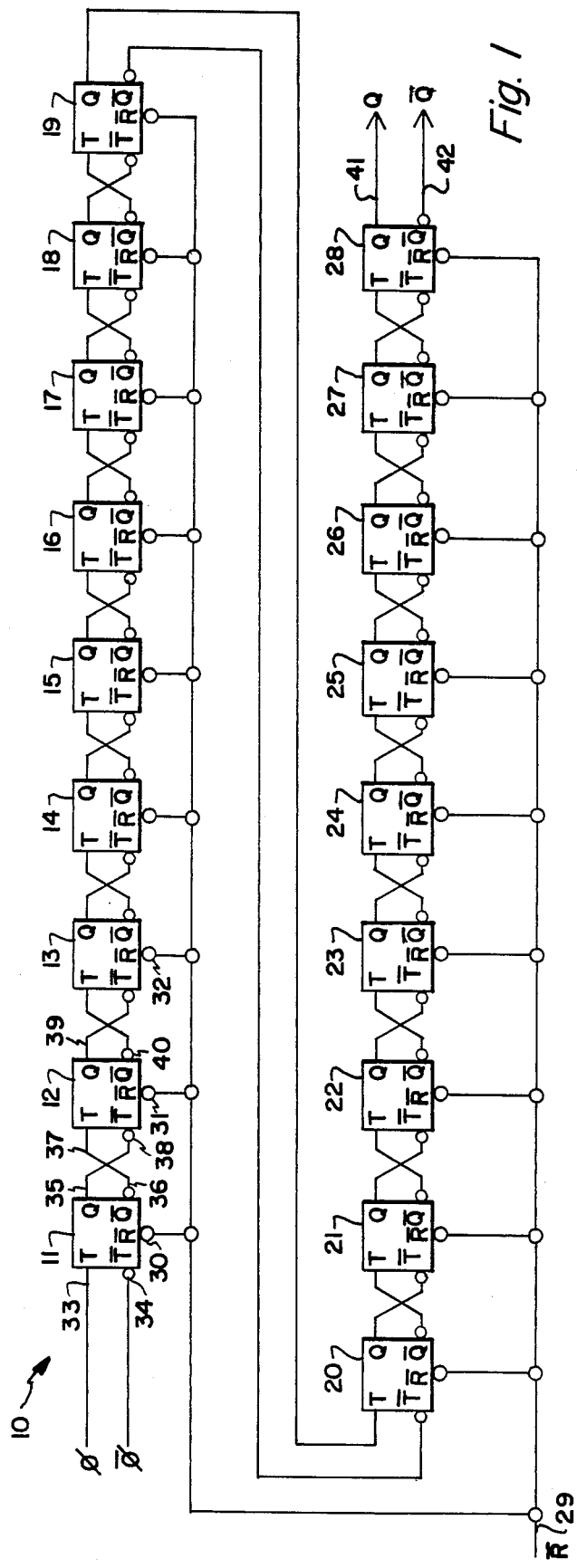
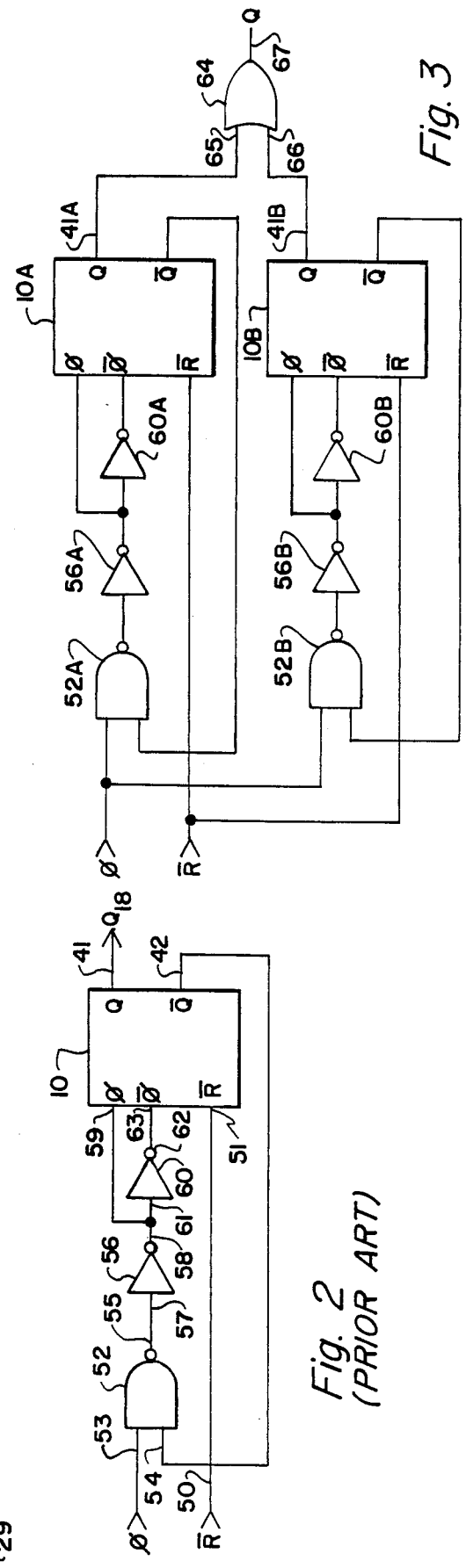
Fig. 1
Fig. 2 (PRIOR ART)
Fig. 3

FAULT TOLERANT INTEGRATED CIRCUIT DESIGN

The present invention relates to integrated circuits having improved reliability and more particularly to digital integrated circuits having a tendency to lock at a value of "0" or "1" due to defective manufacture.

BACKGROUND OF THE INVENTION

In the field of semiconductor integrated circuits a large number of identical circuits are commonly manufactured using a single sheet of semiconductor material known in the art as a wafer. The wafer is then diced to separate the individual integrated circuits. Each integrated circuit thus separated is known as a die or a chip.

The distribution of defects on a wafer is reasonably predictable. Commonly any one defect on a die will prevent that die from functioning properly. Therefore, a predictable number of defective dice will be produced on each wafer. Therefore, a common goal in the production of semiconductor integrated circuits is to reduce the number of defects or otherwise improve the yield of properly functioning circuits. Various techniques are used to accomplish this.

One technique, which is particularly effective in semiconductor dice involving what is known as a pad limited design, is the use of redundancy. A pad limited design is one in which the positioning of electrical contact pads on the surface of the die in order to facilitate electrical contact with other circuitry requires the use of a larger die than would be required simply for the circuitry in the chip. Thus, additional circuit elements may be provided without increasing the die's size. If the additional circuit elements thus provided are identical to circuit elements already present in the basic design, the die is said to be redundant with regard to those circuit elements. Typically, when redundant circuitry is used, each die must be tested to determine if there is a defect in any of the redundant circuits. When one of the circuit elements is found to be good it is connected to the remainder of the circuitry by means of electrical conductors, typically deposited on the surface of the die.

This prior art method requires testing of the circuit elements in order to determine whether a particular element is good. Further it requires the additional step of depositing conductors on the surface to complete the circuit and connect the good circuit elements into the circuit. A preferrable system would provide redundancy without the requirement of testing and preferential wiring.

SUMMARY OF THE INVENTION

The present invention provides a plurality of similar integrated circuit structures on a single die. Such similar structures are adapted to receive the same input signal and have their output signals applied to an OR gate. In this way, if any one of the structures so connected functions properly, the entire circuit will function properly. Furthermore, no testing or wiring of any of the individual elements is required beyond that which is done in the normal processing sequence.

BRIEF DESCRIPTION OF THE DRAWINGS

FIG. 1 is a block diagram of a circuit with which the current invention may be used;

FIG. 2 is a block diagram of a prior art implementation of the circuit of FIG. 1; and FIG. 3 is a block diagram of an implementation of the circuit of FIG. 1 using the present invention.

DETAILED DESCRIPTION OF THE PREFERRED EMBODIMENT

The present invention is intended to work primarily with digital circuits and specifically with digital circuits in which defects typically cause the circuit, or a portion of the circuit, to latch at a value of 0 or 1. An example of a circuit element which may be provided redundantly using the current invention is shown in FIG. 1. In the circuit of FIG. 1 a counter 10 includes 18 flip-flops, 11 through 28. Flip-flops 11 through 28 are similar to one another. Flip-flop 11, for example, has a reset input 30 identified as $\overline{R}$. It also has T and $\overline{T}$ inputs 33 and 34. The outputs are Q and $\overline{Q}$ 35 and 36, respectively.

In operation all of flip-flops 11 through 28 must first be reset. This is accomplished by applying a low voltage or 0 value to the normally high $\overline{R}$ input 29 and thus to the $\overline{R}$ inputs of all of the flip-flops. This causes all of the flip-flops to reset bringing all of the Q outputs to a low voltage or 0 value and all of the $\overline{Q}$ outputs to a high voltage or 1 value. After the reset signal is issued, clock signal $\phi$ is assumed to cycle on a periodic basis between low and high voltages. Clock signal $\overline{\phi}$ is the complement of clock signal $\phi$ and therefore will also cycle between the low and high voltages. When clock signal $\phi$ changes from a low voltage to a high voltage and clock signal $\overline{\phi}$ changes from a high voltage to a low voltage the output at Q output 35 and $\overline{Q}$ output 36 of flip-flop 11 will change their states, that is change from low voltage to a high voltage or from a high voltage to a low voltage. Therefore, the first time that clock signal $\phi$ goes high following the reset, the signal on the Q output 35 of flip-flop 11 will change from a low voltage state to a high voltage state and the signal on $\overline{Q}$ output 36 will change from a high voltage state to a low voltage state. Then $\phi$ will revert to a high voltage state and $\overline{\phi}$ to a high voltage state. This will have no effect on the output signals from flip-flop 11. When $\phi$ again goes high, and thus $\overline{\phi}$ again goes low, the output from flip-flop 11 will again change states. At that time the signal on Q output 35 of flip-flop 11 will change from a high to a low voltage state and the signal on $\overline{Q}$ output 36 will change from a low to a high voltage state. Since Q output 35 is electrically connected to $\overline{T}$ input 38 of flip-flop 12 and $\overline{Q}$ output 36 is electrically connected to T input 37 of flip-flop 12, T input 37 of flip-flop 12 receives a low to high voltage transition and $\overline{T}$ input 38 of flip-flop 12 receives a high to low transition. Thus, the state of outputs 39 and 40 of flip-flop 12 will change.

Thus it is clear that the output signals from flip-flop 12 will change at a rate ½ that of flip-flop 11. Similarly, the output signals from flip-flop 13 will change at a rate ½ that of those from flip-flop 12. Those skilled in the art will perceive that outputs 41 and 42 of flip-flop 28 will change state once for every 262,144 times that the $\phi$ and $\overline{\phi}$ signals change state. Thus, this circuit may be used to provide a time delay.

FIG. 2 shows a typical design in which the counter of FIG. 1 might be used. Counter 10 represents the structure of FIG. 1. FIG. 2 also includes NAND gate 52 having inputs 53 and 54 and output 55, inverter 56 having input 57 and output 58, and inverter 60 having input 61 and output 62. When the $\overline{R}$ signal applied to line 50 goes to a low voltage value that voltage is applied to $\overline{R}$ input 51 of counter 10. As explained above, this resets all of the flip-flops in counter 10. Therefore, the signal at $\overline{Q}$ output 42 of counter 10 will assume a high value. Since $\overline{Q}$ output 42 is electrically connected to input 54 of NAND gate 52 that high voltage is applied to input 54 of NAND gate 52. With input 54 of NAND gate 52 held at a high value NAND gate 52 will be controlled by the signal applied to input 53. Whenever clock signal $\phi$ goes high the output signal from NAND gate 52, presented at NAND gate 52 output 55, will go low. Whenever the clock signal $\phi$ goes low the output signal from NAND gate 52 at NAND gate output 55 will go high.

Output 55 of NAND gate 52 is electrically connected to inverter 56 input 57. Inverter 56 will invert its input signal, i.e. provide a low voltage output for a high voltage input or a high voltage output for a low voltage input, and present its output signal at inverter 56 output region 58. Therefore, the signal at output region 58 will be the same as the clock signal $\phi$. Output region 58 of inverter 56 is directly electrically connected to $\phi$ input region 59 of counter 10. Furthermore, output region 58 of inverter 56 is electrically connected to input region 61 of inverter 60. Inverter 60 again inverts the clock signal and provides that inverted signal at output region 62. Output region 62 is electrically connected to $\phi$ input region 63 of counter 10.

Counter 10 will operate as described above until flip-flop 28 changes state causing the Q output signal at Q output region 41 to go high and $\overline{Q}$ output signal at $\overline{Q}$ output region 42 to go low. At that time, the signal presented at input region 54 of NAND gate 52 will go low. Therefore, NAND gate 52 will produce only a high output and further operation of the circuit is prevented until another reset signal is issued.

Typical defects which may arise in one of flip-flops 11 through 28 of counter 10 will cause the output of the flip-flop containing the defect to latch at either high or low voltage values. Therefore, a reset signal applied to the $\overline{R}$ input or a state change on the T and $\overline{T}$ inputs of that flip-flop will not affect the value of the output signals from that flip-flop. Therefore, signals will not be propagated along the chain of flip-flops as described above for FIG. 1.

FIG. 3 shows a fault-tolerant version of the circuit of FIG. 2 constructed according to the present invention. As may be seen, all elements of the circuit of FIG. 2 are duplicated by a second set of components which run in parallel with the first set. Each set of components receives identical input signals. In addition to the components provided in FIG. 2, however, an OR gate 64 having inputs 65 and 66 and output 67 are provided. Input 65 of OR gate 64 is electrically connected to Q output 41A of counter 10A and input 66 of OR gate 64 is electrically connected to output 41B of counter 10B.

Therefore, the Q output signal at output 67 of OR gate 64 will be at a high voltage value if either output 41A of counter 10A or output 41B of counter 10B go to a high voltage state. Therefore, the circuit will work properly if either counter 10A, counter 10B, or both are working properly.

Those skilled in the art will readily perceive that the circuit of FIG. 3 is only one example of a fault-tolerant digital circuit which could be constructed according to the present invention. Any type of digital circuit element which would normally latch to either a 0 or a 1 due to a manufacturing defect could replace counters 10A and 10B. One commonly used example of a circuit with which the present invention would be useful is a shift register. In any case, the present invention provides a fault-tolerant circuit through the use of redundancy without any requirement of testing individual circuit elements or preferential wiring of defect free elements. Therefore, redundancy may be achieved without incurring any additional processing steps, or, in the case of pad limited designs, any significant additional expense.

The embodiments of the invention in which an exclusive property or right is claimed are defined as follows:

1. A fault-tolerant semiconductor integrated circuit comprising:
   first digital circuit element means having input means and output means;
   second digital circuit element means having input means and output means, said first and second digital circuit element means being functionally identical and said first digital circuit element input means being electrically connected to said second digital circuit input means; and
   combining logic gate means having a plurality of input means, at least one of said combining logic gate means input means being electrically connected to said first digital circuit element output means and at least one of said combining logic gate means input means being electrically connected to said second digital circuit element output means.

2. The circuit of claim 1 wherein said combining logic gate means includes a logical OR gate means.

3. The circuit of claim 1 wherein each of said first and second digital circuit element means includes a plurality of flip-flop means.

4. The circuit of claim 3 wherein said combining logic gate means includes a logical OR gate means.

5. The circuit of claim 1 wherein each of said first and second digital circuit elements includes a shift register means.

6. The circuit of claim 5 wherein said combining logic gate means includes a logical OR gate means.

* * * * *